United States Patent [19]

Vaughan, Jr.

[11] Patent Number: 5,744,957
[45] Date of Patent: Apr. 28, 1998

[54] CAVITY RESONATOR FOR NMR SYSTEMS

[75] Inventor: John Thomas Vaughan, Jr., Lynnfield, Mass.

[73] Assignee: UAB Research Foundation, Birmingham, Ala.

[21] Appl. No.: 515,268

[22] Filed: Aug. 15, 1995

[51] Int. Cl.⁶ .................................................. G01R 33/20
[52] U.S. Cl. .................................................. 324/318
[58] Field of Search .......................... 333/219, 219.1; 324/318, 314, 300, 316, 322; 335/296, 299

[56] References Cited

U.S. PATENT DOCUMENTS

| | | | |
|---|---|---|---|
| 4,439,733 | 3/1984 | Hinshaw et al. | 324/322 |
| 4,446,429 | 5/1984 | Froncisz et al. | 324/316 |
| 4,504,788 | 3/1985 | Froncisz et al. | 324/316 |
| 4,602,234 | 7/1986 | Butson | 335/299 |
| 4,633,180 | 12/1986 | Biehl et al. | 324/318 |
| 4,641,097 | 2/1987 | Bottomley et al. | 324/318 |
| 4,694,255 | 9/1987 | Hayes | 324/318 |
| 4,712,067 | 12/1987 | Roschmann et al. | 324/318 |
| 4,717,880 | 1/1988 | Ono et al. | 324/316 |
| 4,737,718 | 4/1988 | Kemner et al. | 324/322 |
| 4,742,320 | 5/1988 | Pfizenmaier et al. | 333/219 |
| 4,746,866 | 5/1988 | Roschmann | 324/318 |
| 4,751,464 | 6/1988 | Bridges | 324/318 |
| 4,799,016 | 1/1989 | Rezvani | 324/318 |
| 4,820,985 | 4/1989 | Eash | 324/318 |
| 4,875,013 | 10/1989 | Murakami et al. | 324/322 |
| 4,916,418 | 4/1990 | Rath | 333/219 |
| 4,949,044 | 8/1990 | Starewicz et al. | 324/320 |
| 4,952,878 | 8/1990 | Mens et al. | 324/322 |
| 4,992,737 | 2/1991 | Schnur | 324/318 |
| 5,017,872 | 5/1991 | Foo et al. | 324/322 |
| 5,047,720 | 9/1991 | Guy | 324/320 |
| 5,049,821 | 9/1991 | Duensing et al. | 324/322 |
| 5,055,853 | 10/1991 | Garnier | 343/769 |
| 5,139,024 | 8/1992 | Bryant et al. | 324/318 |
| 5,277,183 | 1/1994 | Vij | 324/318 |
| 5,311,160 | 5/1994 | Higuchi et al. | 333/219.1 |
| 5,349,297 | 9/1994 | DeMeester et al. | 324/318 |
| 5,381,122 | 1/1995 | Laskaris et al. | 335/216 |
| 5,382,904 | 1/1995 | Pissanetzky | 324/319 |

OTHER PUBLICATIONS

The Toroid Cavity NMR Detector, Klaus Woelk et al. Journal of Magnetic Resonance, Series A 109, 137–146 (1994).

High Frequency Volume Coils for Clinical NMR Imaging and Spectroscopy, J. Thomas Vaughan et al. Magnetic Resonance in Medicine MRM 32:206–218 (1994).

Investigations of Surface Coil Geometries Using Rotating Frame Imaging, Geoffrey David Clarke, M.S., (Dissertation) The University of Texas Health Science Center at Dallas, Nov. 1984, pp. 160–162.

A High Frequency Body Coil for Clinical NMR, J.T. Vaughan et al. Proceedings of the Second Scientific Meeting of the Society of Magnetic Resonance, p. 1113 (1994).

(List continued on next page.)

*Primary Examiner*—Sandra L. O'Shea
*Assistant Examiner*—Raymond Y. Mah
*Attorney, Agent, or Firm*—Gifford, Krass, Groh, Sprinkle, Patmore, Anderson & Citkowski, P.C.

[57] ABSTRACT

A cavity resonator is disclosed for use in nuclear magnetic resonance (NMR) systems. The resonator has a housing defining a cavity having a selected length and cross-sectional shape. A layer of electrically conductive material is provided around at least a portion of the housing enclosing a dielectric material (air, gasses, teflon, etc.) and the cavity is energized at a Larmor radio frequency useful for NMR systems. The cavity, i.e. a volume enclosed by conductive walls, furthermore, is dimensioned to resonate at the selected radio frequency to thereby generate an alternating magnetic field through the cavity. An opening in the housing is adapted to be placed adjacent an object to be analyzed.

22 Claims, 2 Drawing Sheets

OTHER PUBLICATIONS

A Double Resonant Surface Coil for 4.1 Tesla Whole Body NMR, J.T. Vaughan et al. Proc. Tenth Annual Scientific Meeting of the Society of Magnetic Resonance in Medicine, p. 722 (1991).

Proton Nuclear Magnetic Resonance Spectroscopic Imaging of Human Temporal Lobe Epilepsy at 4.1 T, Hoby Hetherington et al. Annals of Neurology, vol. 38, No. 3, Sep. 1995, pp. 396–403.

High Resolution Neuroimaging At 4.1 T, Jullie W. Pan et al. Magnetic Resonance Imaging, vol. 13, No. 7, 1995, 0730–725X (95) 02002–B.

Imaging at High Magnetic Fields: Initial Experiences at 4 T, Kamil Ugurbil, et al. Magnetic Resonance Quarterly, vol. 9, No. 4, pp. 259–277 (1993).

1.5 in Vivo $^{31}$P NMR Spectroscopy of the Human Liver Using a Sectorial Resonator, Thomas M. Grist et al. Magnetic Resonance in Medicine 3, 135–139 (1986).

Slotted Tube Resonator: a New NMR Probe Head at High Observing Frequencies, H.J.Schneider et al. Rev. Sci. Instrum. 48,68 (1977).

In Vivo Magnetic Resonance Imaging and Spectroscopy of Humans with a 4T Whole–Body Magnet, H. Barfuss et al. NMR Biomed.3,31 (1990).

A High Frequency Tuned Resonator for Clinical NMR, J.T. Vaughan et al. in "Proc., SMRM, 11th Annual Meeting, Berlin, 1992" p. 279.

High Frequency Coils for Clinical Nuclear Magnetic Resonance Imaging and Spectroscopy, J.T. Vaughan et al. Phys. Med. IX, 147 (1993).

A High Frequency Double Tuned Resonator for Clinical NMR, J.T. Vaughan et al. in "Proc.,SMRM, 12th Annual Meeting, New York, 1993" p. 306.

Comparison of Linear and Circular Polarization for Magnetic Resonance Imaging, G.H. Glover et al. J. Magn. Reson. 64, 255 (1985).

Spectroscopy and Imaging with a 4 Tesla Whole–body MR System, H. Bomsdorf. NMR Biomed. 1, 151 (1988).

High Field/Low Field Comparisons of RF Field Distribution, Power Deposition, and S/N for Human NMR, J.T. Vaughan et al. in "Proc. SMRM, 10th Annual Meeting, San Francisco, 1992" p. 1114.

The Theory of the Bird Cage Resonator, J. Tropp. J. Magn. Reson. 82, 51 (1989).

Explicit Treatment of Mutual Inductance in Eight–Column Birdcage Resonators, R. Pascone et al. Magn. Reson. Imaging 10, 401 (1992).

High–Resolution Neuroimaging at 4.1 T, H.P.Hetherington et al. J.Magn. Reson.Imaging 3(P), 313 (1993).

RF Limitations to High–Field–Strength Clinical Imaging, J.T.Vaughan et al. J. Magn. Reson. Imaging 3(P), 314 (1993).

High Resolution Neuroimaging at 4.1T, J.W. Pan et al. in "Proc., SMRM, 12th Annual Meeting, New York, 1993" p. 333.

High Resolution MRI at 4.1T of the Hippocampus in Temporal Lobe Epilepsy, R.Kuzniecky et al. in "Proc. SMRM, 12th Annual Meeting, New York, 1993" p. 484.

Evaluation of Multiple Sclerosis by High Field Spectroscopic Imaging, J.W. Pan et al. in "Proc. SMRM, 12th Annual Meeting, NY 1993" p. 1552.

A Sequence for High Resolution $^1$H Spectroscopic Imaging Without FOV Restriction: Imaging the Human Brain with 0.5cc Voxels at 4.1T, H.P. Hetherington. "Proc. SMRM, 12th Annual Meeting, NY 1993" p. 901.

Short–echo Spectroscopic Imaging of Glutamate at 4.1T in Human Brain in Vivo, G.F.Mason et al. "Proc. SMRM, 12th Annual Meeting, NY 1993" p. 368.

High Resolution $^1$H Spectroscopic Imaging of Human Brain at High Field: Quantitative Evaluation of Gray and White Matter Metabolite Differences, H.P.Hetherington et al. "Proc. SMRM, 12th Annual Meeting, NY, 1993" p. 127.

High Resolution 3–D Cerebral Activation Mapping at 4.1Tesla, D.B.Tweig "Proc. SMRM, 12th Annual Meeting, New York, 1993" p. 1389.

Jesmanowicz A., Grist Thomas M., Fraoncisz, James S., "Sectorial Loop–Gap Resonator for 31 p NMR of the Human Liver", *Society of Magnetic Resonance in Medicine*, Book of Abstracts, vol. I, 489–490 (1985).

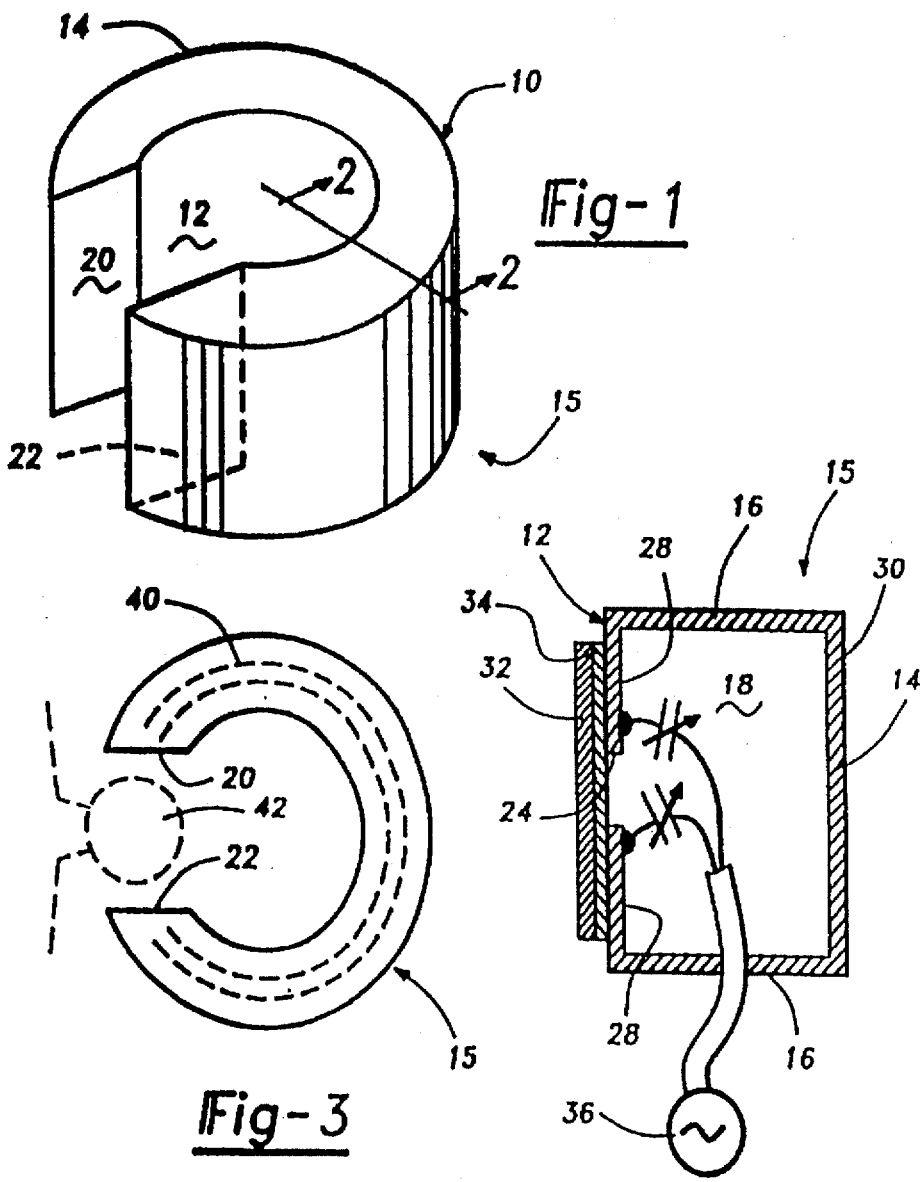
Fig-1
Fig-3
Fig-2
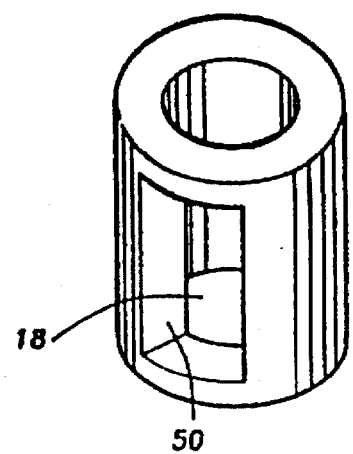
Fig-4

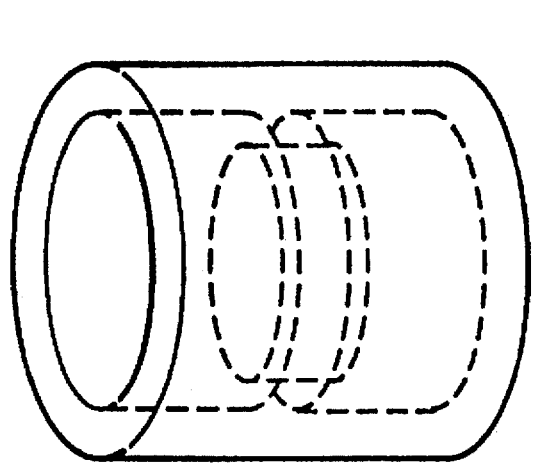
*Fig-5b*
*Fig-5a*
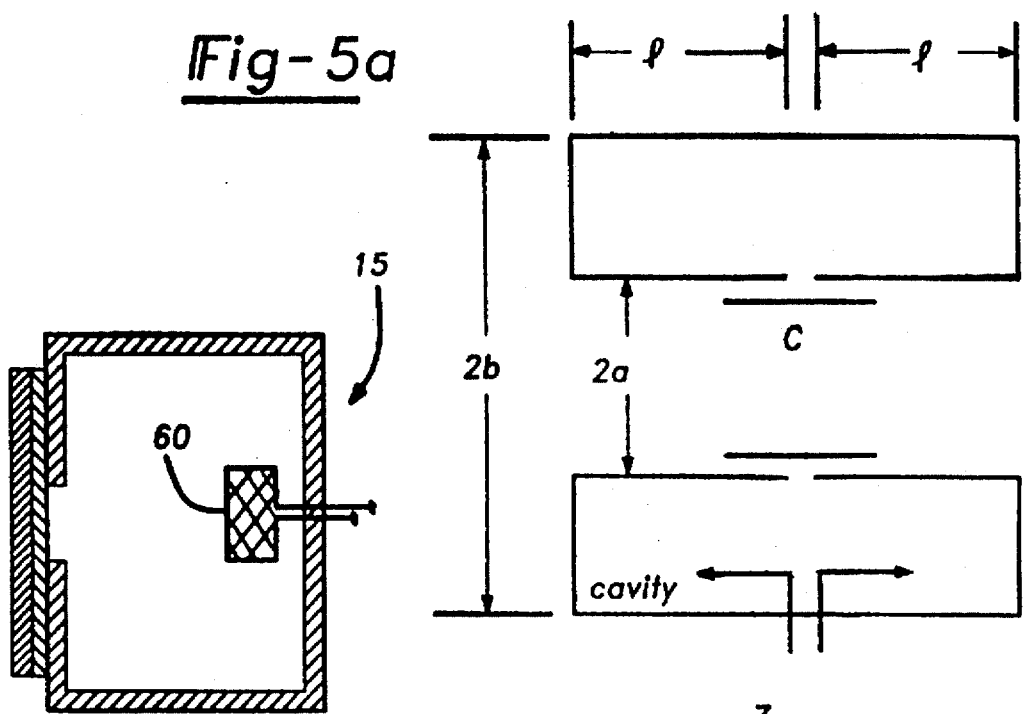
*Fig-6*
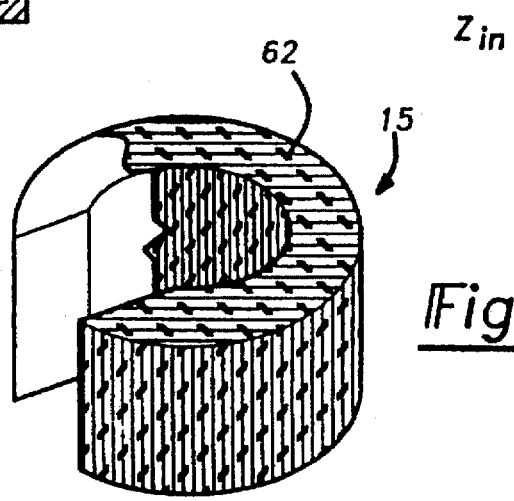
*Fig-7*

CAVITY RESONATOR FOR NMR SYSTEMS

BACKGROUND OF THE INVENTION

1. Field of the Invention

The present invention relates to a cavity resonator for use in nuclear magnetic resonance systems.

2. Description of the Prior Art

There are many previously known resonators for use in nuclear magnetic resonance (NMR) systems for imaging and spectroscopy. For example, one type of previously known device is commonly known as a bird cage resonator. These previously known bird cage resonators typically comprise a plurality of circumferentially spaced inductive/capacitive elements which are driven at resonance by a Larmor radio frequency useful for NMR systems. The object to be analyzed, e.g. the brain, is positioned within the resonator during the operation of the NMR system.

One disadvantage of these previously known resonators, however, is that they typically use lumped circuit elements (discrete inductors and capacitors) to achieve resonance at the selected radio frequency. Because discrete (lumped) inductor and capacitor elements confine RF current to less conductive areas and longer conductive path lengths, lumped element circuits are inherently more resistive and more inductive than distributed circuits. Because lumped element circuits are more resistive, they are electrically less efficient and have a lower Q factor. Similarly because lumped element circuits are more inductive, they resonate at lower frequencies than do the less inductive distributed (cavity) circuits.

These previously known resonators which utilize lumped circuit elements suffer from several other disadvantages. One such disadvantage is nonuniform current distributions which result in decreased homogeneity, decreased fill factor and increased electric field losses. Especially at higher frequencies and for larger (clinical) volumes, lumped circuit element resonators may achieve self resonance below the desired frequency of operation as well as increased electromagnetic radiation losses. All of these factors together degrade the overall quality of NMR images and spectra.

SUMMARY OF THE INVENTION

The present invention provides a distributed circuit cavity resonator for NMR systems which overcomes all of the above-mentioned disadvantages of the previously known devices.

In a preferred embodiment of the invention, the cavity resonator of the present invention comprises a generally toroidal cylindrical housing having a cylindrical inner wall and a cylindrical outer wall which is spaced apart and substantially parallel to the inner wall. Spaced end walls extend across the inner and outer walls at each axial end of the housing so that the inner, outer and end walls together form a cavity.

The inner, outer and end walls are then coated with a thin foil, plated, deposited, etc., conductive material, such as copper, silver or gold. In doing so, the housing approximates a coaxial line segment shorted at both ends and made resonant at Larmor frequencies useful for NMR, such as 64 MHz (1.5 T), 175 MHz (4.1 T) or 170 MHz (4 T).

Any conventional means is then used to excite or energize the housing such that the housing resonates at the selected NMR frequency. Since the resonator approximates a coaxial line segment shorted at both ends, the cavity forms a transverse electromagnetic resonator which produces an alternating magnetic field longitudinally through the housing. An opening is then formed in the housing and the object to be analyzed is then placed within the opening or adjacent the opening such that the alternating magnetic field passes through the object in the desired fashion.

In one form of the invention, the inner wall is slit thus forming two subwalls that are axially aligned with each other. A slidable capacitor plate then capacitively couples the subwalls together such that adjustment of the position of the capacitor plate tunes the resonator to the desired frequency. Other frequency tuning methods, such as inductive tuning or dielectric tuning, may alternatively be used.

BRIEF DESCRIPTION OF THE DRAWINGS

A better understanding of the present invention will be had upon reference to the following detailed description, when read in conjunction with the accompanying drawing, wherein like reference characters refer to like parts throughout the several views, and in which:

FIG. 1 is an elevational view illustrating a first preferred embodiment of the present invention;

FIG. 2 is a sectional view taken substantially along line 2—2 in FIG. 1;

FIG. 3 is a diagrammatic top view illustrating the preferred embodiment of the present invention;

FIG. 4 is an elevational view of a second preferred embodiment of the present invention;

FIG. 5a diagrammatically illustrates a coaxial linear cavity segment electrically shorted at each end and FIG. 5b represents a diagrammatic longitudinal sectional view of FIG. 5a;

FIG. 6 is a view similar to FIG. 2 but illustrating a mechanism for inductively tuning the coil; and FIG. 7 is a view similar to FIG. 1 but illustrating a dielectric tuning mechanism and impedance matching.

DETAILED DESCRIPTION OF A PREFERRED EMBODIMENT OF THE PRESENT INVENTION

With reference first to FIGS. 1 and 2, a first preferred embodiment of the toroidal cavity resonator or radio frequency coil 15 of the present invention is there shown and comprises a nonconductive, dielectric filled housing 10 which can be tubular and cylindrical in shape. As such, the housing 10 includes a cylindrical or annular inner wall 12 and a cylindrical or annular outer wall 14 which is spaced apart and parallel to the inner wall 12. End walls 16 extend across the inner wall 12 and outer wall 14 at each axial end thereof thus forming an annular housing chamber or cavity 18 which is generally rectangular in cross-sectional shape (see FIG. 2) although other shapes can be alternatively used.

Still referring to FIGS. 1 and 2, an arc section of the housing 10 is removed so that the housing is generally C-shaped when viewed from one axial end thus having a pair of open ends 20 and 22 which generally face each other. Furthermore, as best shown in FIG. 2, an elongated slit 24 is provided through one of the walls 12–16, and preferably through the inner or outer wall 12 or 14, thus dividing the inner or outer wall 12 or 14 into two axially adjacent subwall sections 26 and 28. This gap 24, furthermore, extends from one open end 20 to the other open end 22 of the housing 10.

The walls 12, 14 and 16 of the housing or surface of a rigid dielectric 10 are covered with an electrically conductive material, such as a copper, silver or gold foil, so that the cavity resonator approximates a coaxial transmission line shorted at both ends. Furthermore, the thickness of the electrically conductive foil is preferably selected so that it has a skin depth thickness of $1/\sqrt{\pi f \mu \sigma}$ where f is the resonant frequency of the cavity resonator. For example, for f equals 100 MHz, the preferred thickness of the conductive layer 30 would be 0.0066 mm. The selection of the proper thickness for the conductive layer 30 not only adequately conducts the high frequency radio signal due to the skin effect, but also attenuates the undesired lower frequency switched gradient field induced transient currents. Such transient currents can result in $B_0$ eddy current artifacts, noise, and other undesirable effects.

Referring now particularly to FIG. 2, an annular capacitor plate 32 having a dielectric layer 34 is positioned adjacent the inner wall 12 so that the dielectric layer 34 faces and overlies the subwalls 28. In doing so, the plate 32 capacitively couples the subwalls 28 and enables the resonant frequency of the cavity resonator to be adjusted by axially sliding the capacitor plate 32 relative to the inside wall 12. In this fashion, the capacitive coupling between the side walls 28, and the resonant frequency of the cavity resonator, can be tuned to the desired frequency.

With reference now to FIG. 6, in lieu of (or in addition to) the variable capacitive coupling of the subwalls 28 shown in FIG. 2, a flux paddle 60 is positioned within the cavity 18. The flux paddle is a conductive (radio frequency magnetic flux opaque) surface that can be inserted or manipulated to interrupt the $B_1$ field. Rotation of the paddle 60 varies the inductance of the cavity resonator 15 and thus varies the resonant frequency of the cavity resonator 15. The paddle 60, of course, can be of any desired shape. An LC coil could also be used in lieu of or in addition to the flux paddle.

The cavity can also be inductively driven, tuned and matched with an inductive loop coupled inductively, of course, to the cavity.

With reference now to FIG. 7, the resonant frequency of the cavity resonator or coil 15 may alternatively be controlled or varied by filling the cavity 18 with a dielectric 62. Different dielectrics having different dielectric constants vary the resonant frequency of the coil 15.

The use of a dielectric 62 within the cavity also serves several useful functions. First, since the electrically conductive layer 30 may be applied directly to the dielectric 62, the dielectric 62 in effect forms the housing or support for the conductive layer 30. Dielectric fill material can be used to tune the coil to a single frequency.

Similarly, the dielectric 62 enables the coil 15 to resonate at two radio distinct frequencies. At one frequency, the current flow through the conductive layer 30 is on the side of the layer 30 facing the dielectric 62 due to the skin effect so that the resonant frequency of the coil 15 is controlled by the dielectric constant of the dielectric 62. At a second frequency, current flow occurs around the outer side of the conductive layer 30 so that the resonant frequency of the coil 15 is controlled by the dielectric material of the material surrounding the conductive layer, i.e. typically air.

Lastly, proper selection of the dielectric 62 enables close impedance matching between the coil and the target object. Such impedance matching minimizes or altogether eliminates unwanted signal reflections of the coil target interface. Dielectric material at the openings or apertures of the cavity can be used as a "lens" to "focus" RF flux lines to the target region.

Referring now to FIGS. 2 and 3, any conventional means can be utilized to energize or excite the cavity resonator such that it resonates at a frequency useful for NMR systems. As shown in FIG. 2, however, a radio frequency generator 36 is capacitively electrically connected to the subwalls 28 to resonate the cavity at the selected frequency. Alternatively, inductive coupling or any other means may be used to energize the cavity resonator at the selected radio frequency.

As is well known in NMR imaging and spectroscopy, certain frequencies corresponding to the nuclear resonance frequency of the target nucleus are utilized. These frequencies, known as Larmor frequencies, include 64 MHz and 175 MHz as well as other frequencies.

With reference now particularly to FIG. 3, energization of the resonant cavity by activation of the source 36 produces an alternating magnetic field with flux lines 40 extending longitudinally through the cavity 18 and thus between the open ends 20 and 22 of the housing 10. An object to be analyzed, such as a brain 42, is then positioned between the open ends 20 and 22 of the housing so that the flux lines 40 of the alternating magnetic field pass through the object 42 in the desired fashion. Flux lines can be shaped with dielectric material adjacent to or surrounding object.

With reference now to FIGS. 5a and 5b, the coil 15 of the present invention can be described as a coaxial cavity. As such, transmission line theory is employed to determine the proper dimensions of the housing to achieve resonance at the desired NMR frequencies. Using transmission line theory, approximations of the distributed impedance coefficients R, L, C, the fundamental TEM mode resonance, and the Q of this cavity can be made. The input impedance $Z_{in}$ to each shorted coaxial half cavity is given by Eq.[1] where $Z_o$ is the cavity's characteristic impedance. For a coaxial cavity whose outside radius is b and whose inside radius is a, $$Z_{in}=Z_0\tanh((\alpha+j\beta)l), \alpha=R/2Z_0 \quad [1]$$

$$\text{for } Z_0=(\eta_0/2\pi)\ln(b/a) \; L=2X_{in}/\omega=2Z_0\tanh((\alpha+j\beta)l)/\omega \quad [2]$$

Compared to a lumped element coil circuit enclosing a given volume, the inductance L of the coaxial cavity containing the same volume is significantly lower. The center gap series capacitance C required to resonate this cavity at the design frequency $f=\omega/2\pi$ is:

$$C=1/\omega X_{in}=1/\omega[Z_0\tanh((\alpha+j\beta)l)] \quad [3]$$

This center conductor gap capacitance could be supplied by a capacitive ring as pictured in FIG. 2. Stray capacitance $C_s$ between the inner and outer walls of the coaxial cavity contributes a small fraction of the cavity's total capacitance at operating frequencies, but ultimately limits the cavity's self resonance at frequencies exceeding 400 MHz for head sized coils. The stray capacitance for the coaxial cavity is, $$C_s=\pi\epsilon l/\ln(a/b) \quad [4]$$

The fundamental TEM mode resonant frequency $f_0$ of the cavity is approximated by:

$$f_0=1/[2\pi\sqrt{(LC)}] \quad [5]$$

The series conductor resistance R in the cavity is determined by the frequency dependent surface resistance $R_s$:

$$R=(R_s/2\pi)(1/a+1/b)2l, \text{ where } R_s=\sqrt{(\omega\mu_0/2\sigma)}=1/\sigma\delta, \text{ for } \delta=1/\sqrt{(\pi f \mu \sigma)} \quad [6]$$

Shallow 1/e skin depth δ of current flux in a good conductor $\sigma=6(10^7)$, S/m makes for the requirement of a large surface area of cavities for minimizing R. The small, high frequency skin depth dimension however allows the use of very thin conductors which adequately conduct (and contain) RF currents and fields, but effectively attenuate low frequency eddy current propagation induced by switching $B_0$ field gradients. The characteristically high resonant $Q_r$ of the cavity as determined is:

$$Q_r = \beta/2\alpha = 2\pi f_0 L/R = 2\pi f_0 Z_0/R\upsilon \qquad [7]$$

The gap in the coil 15 necessary for sample access, compromises the cavity's performance from the ideal case described above.

Applying the above formulae, the dimensions for a 64 MHz (1.5T) cavity, the dimensions of the housing or coil are as follows:

a=10 cm b=20 cm l=10 cm with a gap width of 20 cm.

The gap width, i.e. the width between the open ends 20 and 22 of the housing, were selected merely to accommodate the size of a normal human head.

Conversely, for a 175 MHz coil, the above formulae produced the following dimension for the coil:

a=10 cm b=17 cm l=7 cm gap width again 20 cm.

Although in the preferred embodiment, the coil is generally tubular and cylindrical in shape with an arc segment removed to accommodate the object to be analyzed, other shapes can be used without deviation from the spirit or scope of the invention. For example, the housing alternatively could be toroidal in configuration ellipsoidal, oval or the like. Likewise, although the inside wall 12 is slit 24 to effectively capacitively shorten the overall length of the coil as well as to provide a convenient means for capacitance tuning, such configuration is by way of example only. Likewise, as shown in FIG. 4, it is unnecessary to remove an arc section from the housing in order to accommodate the object to be analyzed. Instead, an opening 50 to the cavity 18 in any of the walls is sufficient for NMR applications with the opening 50 placed against the area or object to be analyzed. The object (breasts etc.) could be placed inside an aperture as well.

From the foregoing, it can be seen that the present invention provides a resonant cavity or coil for NMR applications. Having described my invention, however, many modifications thereto will become apparent to those skilled in the art to which it pertains without deviation from the spirit of the invention as defined by the scope of the appended claims.

I claim:

1. A resonant cavity device for use in a nuclear magnetic resonance (NMR) system comprising:

a layer of electrically conductive material defining an electromagnetic resonant cavity, said cavity filled with a dielectric material, said cavity exhibiting a distributed impedance load, means for energizing said cavity at a radio frequency useful for NMR systems, wherein said cavity is dimensioned to resonate at said radio frequency to thereby generate an alternating magnetic field of a contour through said cavity; and wherein said cavity includes an electromagnetic field aperture adapted to be positioned adjacent a target object to be analyzed, said aperture being dimensioned to conduct said alternating magnetic field across said aperture.

2. The invention as defined in claim 1 wherein said radio frequency is selected to match a Larmor resonant frequency of a selected nucleus.

3. The invention as defined in claim 1 and comprising means for varying the selected radio frequency.

4. The invention as defined in claim 1 wherein said layer comprises two end walls, an inner wall and an outer wall, said inner and outer walls being spaced apart and parallel to each other, said end walls being spaced apart and parallel to each other and extending between said inner and outer walls.

5. The invention as defined in claim 4 and comprising means for varying the capacitance of one of said walls.

6. The invention as defined in claim 5 wherein said varying means comprises means for varying the capacitance of one of said inner or outer walls.

7. The invention as defined in claim 5 wherein one of said walls includes a through slit extending from one end of said layer to the opposite end of said layer and dividing said last mentioned wall into two aligned subwalls, and wherein said varying means comprises an electrically conductive capacitor plate overlying said slit and at least a portion of each subwall, and an electrical dielectric layer disposed between said capacitor plate and said subwalls.

8. The invention as defined in claim 3 wherein said layer is substantially cylindrical in shape.

9. The invention as defined in claim 1 wherein said layer of conductive material comprises a metallic foil.

10. The invention as defined in claim 1 wherein said layer of conductive material comprises a metallic deposition.

11. The invention as defined in claim 4 wherein said layer is annular in shape.

12. The invention as defined in claim 11 wherein said opening includes a removed arc segment of said housing, said object being positioned within the opening formed by said removed arc segment.

13. The invention as defined in claim 4 wherein said opening comprises a removed section of one of said walls.

14. The invention as defined in claim 3 wherein said frequency varying means comprises means for varying the capacitance of the resonator.

15. The invention as defined in claim 3 wherein said frequency varying means comprises an LC loop positioned in said chamber.

16. The invention as defined in claim 1 wherein said dielectric material is selected to match the impedance of the target object.

17. The invention as defined in claim 1 wherein said layer of conductive material is applied directly to said dielectric material.

18. The invention as defined in claim 1 and comprising means for resonating said resonator at at least two distinct frequencies.

19. The invention as defined in claim 18 wherein said resonating means comprises at least partially filling said cavity with a dielectric.

20. The invention as defined in claim 3 wherein said frequency varying means comprises means for varying the dielectric material in said chamber.

21. The invention as defined in claim 3 wherein said frequency varying means comprises a flux paddle positioned in said chamber.

22. The invention as defined in claim 1 and comprising dielectric means adjacent said opening for directing said alternating magnetic field to the target object.

* * * * *

UNITED STATES PATENT AND TRADEMARK OFFICE
CERTIFICATE OF CORRECTION

PATENT NO.    : 5,744,957
DATED         : April 28, 1998
INVENTOR(S)   : John Thomas Vaughan, Jr.

Page 1 of 1

It is certified that error appears in the above-identified patent and that said Letters Patent is hereby corrected as shown below:

Column 1,
Line 2, please insert the following after "CAVITY RESONATOR FOR NMR SYSTEM":
--                    GRANT REFERENCE
The subject invention was made with government support under a grant from the National Institutes of Health, Grant No. NIH-NCRR RR07723. The government has certain rights in the invention. --

Signed and Sealed this

Twelfth Day of November, 2002

*Attest:*

JAMES E. ROGAN
*Attesting Officer*              *Director of the United States Patent and Trademark Office*

UNITED STATES PATENT AND TRADEMARK OFFICE
CERTIFICATE OF CORRECTION

PATENT NO. : 5,744,957  
APPLICATION NO. : 08/515268  
DATED : April 28, 1998  
INVENTOR(S) : John Thomas Vaughan, Jr.

Page 1 of 1

It is certified that error appears in the above-identified patent and that said Letters Patent is hereby corrected as shown below:

In the Specifications:

Column 1,
Line 2, please insert following "RADIO FREQUENCY VOLUME COILS FOR IMAGING AND SPECTROSCOPY"

--This invention-- [The subject] was made with government support under [a grant from the National Institutes of Health, Grant No. NIH-]NCRR-RR07723--, awarded by the National Institutes of Health--. The government has certain rights in the invention.

Signed and Sealed this
Seventh Day of May, 2013

Teresa Stanek Rea
*Acting Director of the United States Patent and Trademark Office*